United States Patent [19]

Wang

[11] Patent Number: 4,719,629
[45] Date of Patent: Jan. 12, 1988

[54] DUAL FAULT-MASKING REDUNDANCY LOGIC CIRCUITS

[75] Inventor: Wen-Yuan Wang, Hopewell Junction, N.Y.

[73] Assignee: International Business Machines, Armonk, N.Y.

[21] Appl. No.: 792,097

[22] Filed: Oct. 28, 1985

[51] Int. Cl.⁴ ............................................. G06F 11/18
[52] U.S. Cl. ........................................ 371/68; 307/219; 307/441; 307/445; 371/36
[58] Field of Search ........................... 371/36, 68, 63; 307/219, 441, 442, 464, 474, 445, 454, 455, 456

[56] References Cited

U.S. PATENT DOCUMENTS

| | | | |
|---|---|---|---|
| 3,305,735 | 2/1967 | Moreines | 307/441 |
| 3,524,073 | 8/1970 | Tobin | 307/464 |
| 3,558,905 | 1/1971 | Oshima | 307/442 X |
| 3,800,164 | 3/1974 | Miller | 371/36 X |
| 3,859,513 | 1/1975 | Chuang | 371/36 |
| 4,342,112 | 7/1982 | Stodola | 371/63 X |
| 4,617,475 | 10/1986 | Reinschmidt | 371/36 X |

Primary Examiner—Jerry Smith
Assistant Examiner—Robert W. Beausoliel, Jr.
Attorney, Agent, or Firm—Sughrue, Mion, Zinn, Macpeak & Seas

[57] ABSTRACT

An error correcting logic circuit for masking faults on dual redundant interconnections. Both interconnections are inmput to a NAND or AND circuit which includes pull-up resistors to a high potential. The outputs of all the NAND circuits are connected to dual redundant logic circuits, each of which has an emitter-follower output with a load resistor to ground. The outputs of the redundant logic circuits provide the redundant interconnections to other similar error correcting logic circuits.

8 Claims, 3 Drawing Figures

DUAL FAULT-MASKING REDUNDANCY LOGIC CIRCUITS

BACKGROUND

1. Technical Field

The invention relates generally to logic circuits. In particular, the invention relates to a logic circuit design which masks two classes of faults by the use of redundant circuits and interconnects.

2. Background Art

As integrated circuits for logic become ever large and more complex, usually as a result of further minaturization of individual elements, it has become increasingly difficult to produce perfectly operating logic circuits at an acceptable yield. As the dimensions for the electrical components on the integrated chip have become ever smaller, the processing margins have decreased. In the past, the margins were sufficiently large that an acceptable yield of perfect chips has been obtained. This acceptable yield is becoming increasingly difficult to obtain. Furthermore, noise margins have been correspondingly decreasing. That is, logic chip may operate satisfactorily a majority of the time but occasionally a noise transient is randomly impressed upon one of the internal lines and an incorrect logic operation results.

As a result, increasing attention has been devoted to error correcting logic, both for the hard failures of the exceeded processing margins and for the soft failures of the transient noise failures.

It is believed that a large fraction of failures are associated, not with the logic functions themselves, but instead with the interconnections between separated active devices. Internal logic signals often need to be conveyed relatively long distances. If there are a large number of such internal logic signal interconnections, the chip designer attempts to make the interconnection pathways as dense as possible. That is, the interconnections, typically of metal, are made relatively narrow and are separated from neighboring interconnections by minimum distances. There are several dominant failure modes for these interconnections. An interconnection can become separated somewhere in the middle so that the input to the following logic stage sees an open circuit, that is, a floating potential. Another common failure mode is that two neighboring interconnections are shorted together. In many types of logic, when two wires carrying different signals are shorted together, one logic level will dominate over the other. Thus, in the only significant logic combination in this failure mode in which one wire carries a high logic signal and the other carries a low logic signal, a short will produce a predetermined logic signal, for instance a high logic signal in many important technologies. A third common failure mode is where the metal interconnection shorts to a fixed potential, usually a high potential. This failure mode is particularly important when a subtractive etch or reactive ion etching is used to obtain fine metal interconnections.

One technique for masking faults is the use of a triple modular redundancy (TMR). Applying TMR to interconnection faults will require that each interconnection be replaced by three interconnections. Then, at the input to logic block, there would be an error correcting input stage. This error correcting input stage would compare the signals on all three of the interconnections and use as an error corrected output whatever signal is indicated on at least two of the interconnections. That is, there would be a vote between the three redundant wires. In triple modular redundancy there is the assumption that there is only a single fault so that only a single error can be corrected. This single error assumption is common in most error correcting techniques. Triple modular redundancy, although very effective, entails a substantial trade-off in chip design. Tripling the number of interconnections would, of course, require tripling the amount of chip area devoted to the long interconnections. It may be better to, instead, use a single interconnection of lower density to achieve an acceptable reliability without TMR. The area problem becomes even more severe if the triple modular redundancy is extended to include the logic function that the interconnections are driving. Take the example of a two-input logic function, with each input being driven by a long interconnection. For a combined TMR design, there are two sets of three redundant lines. The two sets of three lines are combined in all possible combinations in separate logic circuits and the vote is performed on the output of the logic circuit. However, this approach requires that there be nine logic circuits. Needless to say, this entails a very heavy price in chip area.

SUMMARY OF THE INVENTION

Accordingly, it is an object of this invention to provide a logic circuit which masks common types of failures on input wires.

It is another object of this invention to provide a fault-masking logic circuit which requires less than three redundant interconnections.

DETAILED DESCRIPTION OF THE PREFERRED EMBODIMENTS

Figure 1:
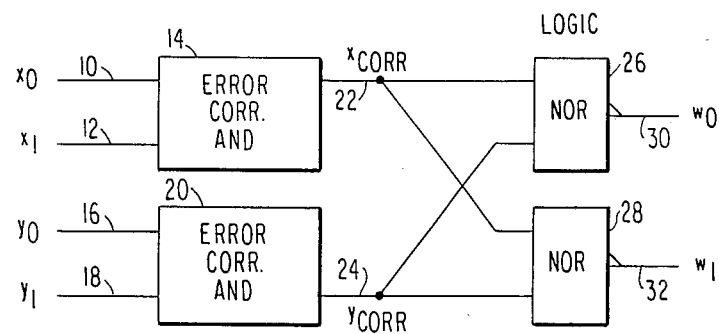
FIG. 1 is a block diagram of an embodiment of an error correction logic stage.

By means of the invention, dual redundant interconnections and error correcting inputs correct many classes of failure. Thus for a logic signal x, there would be two interconnecting wires carrying wire signals $x_0$ and $x_1$. For logic signal y, there would be two wire signals $y_0$ and $y_1$. A relatively simple error corrected logic circuit is shown in FIG. 1 for a NOR function that is, the output $w=NOR(x, y)$. Each of two redundant interconnecting wires 10 and 12, carrying the wire signals $x_0$ and $x_1$, are received by an error correcting AND circuit 14. Similarly, redundant interconnecting wires 16 and 18, carrying wire signals $y_0$ and $y_1$, are received by another error correcting AND circuit 20. The error correcting AND circuits 14 and 20 mask at least some of the faults on the redundant signal lines 10 and 12 or 16 and 18 that they receive and produce corrected signals $x_{CORR}$ or $y_{CORR}$ on their respective outputs 22 and 24. The output lines 22 and 24 are led to both of two redundant logic functions, here represented by NOR circuits 26 and 28 that produce redundant logic outputs $w_0$ and $w_1$ on their respective outputs 30 and 32. The redundant output lines 30 and 32 are led to other logic circuits to be used as inputs, similarly to the redundant lines 10 and 12 for the signals $x_0$ and $x_1$.

The invention can correct a single fault on the redundant input lines 10 and 12 and possibly another single fault on the input lines 16 and 18. The redundancy of the logic blocks 26 and 28 prevents a fault on one of the output lines 30 and 32 from propagating to the other of the output lines 30 and 32. Of course, dual buffer amplifiers connected to a single output would accomplish the same isolation. However, the dual logic blocks 26 and 28 provide further fault redundancy within the logic blocks themselves.

Although the logic function represented in FIG. 1 is a two-input NOR, other logic functions can be similarly accomplished such as a higher order NOR, an OR, an AND or a NOR function. These alternative embodiments would substitute the desired function for each of the logic blocks 26 and 28. If there are additional input variables, then additional error correcting AND circuits would be required. On the other hand, a single error correcting AND circuit 14 can be used if only a single logic signal x is considered to be subject to faults.

The characteristics of the error correcting AND circuit is, of course, crucial to the invention. A normal AND circuit would correct only a limited number of fault types. It would correct any line signal which was spuriously high but would fail to correct a fault signal that was spuriously low. An open interconnection has a floating potential and thus can be either high or low regardless of the driving signal. A conventional AND circuit would not be able to correct this open situation. One embodiment of the error correcting AND circuit corrects three types of faults on either one of the two input lines 10 and 12. Namely, these faults are a short to a high signal, a short to a wrong state of another signal and an open. A short to a wrong state of another signal depends upon the characteristics of the logic technology. This characteristic requires that when two separated lines are shorted together, then the resultant signal is high if either of the signals on the two lines is high. Of course, the invention can be easily modified to accommodate the low signal being the dominant signal and shorts to a low state. The desired truth table for the error correcting AND circuits 14 and 16 is given in Table 1.

TABLE 1

| $x_0$ | $x_1$ | $x_{CORR}$ | Comments |
| --- | --- | --- | --- |
| H | H | H | All correct |
| L | L | L | All correct |
| H | L | L | $x_0$ shorted to H |
| OPEN | H | H | $x_0$ open |
| OPEN | L | L | $x_0$ open |

In the truth table of Table 1, the first two rows represent the situation where both of the redundant input lines carry the correct signals $x_0$ and $x_1$. It should, however, be noted that the correct signal may, in fact, be due to a fault. That is, if the correct logic signal is high but the input line for $x_0$ is shorted high, nonetheless, the wire signal $x_0$ is correct. The third line represents the case when one of the input lines is shorted high while the other input line carries a correct low signal. In this case, the error correcting AND circuit produces a low. The last two lines represent the case when one of the input lines is open but the error correcting AND circuit nonetheless produces the correct output signal $x_{CORR}$. The truth table of Table 1 represents the fault occurring to the line signal $x_0$ but it should be understood that similar results are obtained when the short or the open fault occurs to the wire signal $x_1$.

Figure 2:
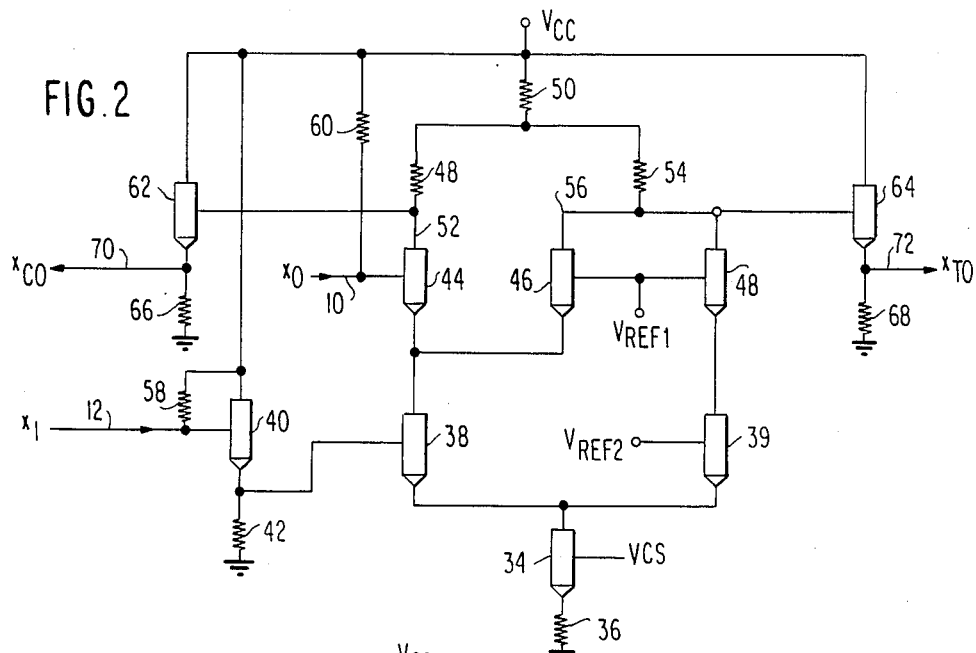
FIG. 2 is a circuit diagram of the error-correcting AND circuit of FIG. 1.

An example of an embodiment of an error correcting AND circuit is given in FIG. 2 with the two redundant interconnections 10 and 12 providing the wire signals $x_0$ and $x_1$ as inputs. The embodiment relies upon a bipolar technology that steers current. A current driving transistor 34 is separated from ground by a resistor 36. A constant voltage VCS is applied to the base of the current driving transistor 34. Because a bipolar transistor maintains a nearly constant base-emitter current of approximately 0.9 V over a wide range of emitter-collector voltages, the voltage at the connection between the resistor 36 and the emitter of the transistor 34 is nearly constant. As a result, a nearly constant emitter-collector current flows through the transistor 34, thus providing a constant current source. The size of the resistor 36 is preferably chosen so that this current is approximately 1 mA. This constant current is switched between a first transistor 38 and a first current steering transistor 39. The base of the first transistor 38 is controlled by a signal voltage while the base of the parallel current steering transistor 39 is controlled by a reference voltage $V_{REF2}$. If the signal voltage applied to the first transistor 38 is higher than the reference voltage $V_{REF2}$, then the first transistor 38 has a lower impedance than the current steering transistor 39 and the constant current mostly flows through the first transistor 38. On the other hand, if this signal voltage is less than the reference voltage $V_{REF2}$, then the constant current predominately flows through the current steering transistor 39.

The first transistor 38 has its base controlled by the emitter output of a first input transistor 40. The first input transistor 40 has its collector connected to a positive power supply at a fixed voltage $V_{CC}$ and has its emitter separated from ground by a resistor 42. The base of the first input transistor 40 is connected to the redundant interconnection 12 carrying the wire signal $x_1$. If the line signal $x_1$ is high, then the first input transistor 40 conducts so that its emitter becomes high and thus steers the constant current through the first transistor 38. If the wire signal $x_1$, on the other hand, is low, the constant current is steered through the first current steering transistor 39.

If the constant current is steered through the first transistor 38, then current steering is again performed between a second input transistor 44 and a second current steering transistor 46. The second input transistor 44 has its collector at a complementary voltage node 52 separated from the power supply voltage $V_{CC}$ by two resistors 48 and 50 and has its base connected to the other redundant line 10 carrying the other wire signal $x_0$. The second steering transistor 46 has its collector at a true voltage node 56 separated from the power supply voltage $V_{CC}$ by resistors 50 and 54. The exact configuration of the resistors 48, 50 and 54 is not important as long as the resistance in each of the current paths is approximately 800 ohms and separate resistors 48 and 54 are provided. The purpose is to provide 400 mV swings, positive and negative, at final output nodes. The base of the second steering transistor 46 is connected to another fixed voltage $V_{REF1}$. The voltage $V_{REF1}$ is larger than the fixed voltage $V_{REF2}$ by about 0.9 V to compensate for one of the base-emitter voltages of the two transistors 38 and 40.

By a current switching operation similar to that previously described, a current through the first transistor 38 is steered through the second input transistor 44 when the wire signal $x_0$ is larger than the fixed voltage $V_{REF1}$ but is steered through the second steering transistor 46 when the wire signal $x_0$ is less than the fixed potential $V_{REF1}$. Another transistor 48 is connected in the current path from the first steering transistor 39, has its base also controlled by the fixed voltage $V_{REF1}$ and has its collector connected to the collector of the second steering transistor 46.

Thus, the two wire signals $x_0$ and $x_1$ are being compared against the fixed potentials $V_{REF1}$ and $V_{REF2}$. If both of the wire signals $x_0$ and $x_1$ are high, then the constant current is steered through the resistor 48. On the other hand, if either of the wire signals $x_0$ and $x_1$ are low, then the constant current is steered through the resistor 54. Thus, the voltage at the complementary voltage node 52 at the lower end of the resistor 48 would be low if both of the wire signals $x_0$ and $x_1$ are high while the voltage at the true voltage node 56 at the lower end of the resistor 54 would be high under this condition. On the other hand, if either of the wire signals $x_0$ and $x_1$ is low, then the voltage at the complementary voltage node 52 is high and the voltage at the true voltage node 56 is low. That is, the signal at the true voltage node 56 represents the logical function AND ($x_0$, $x_1$) and the voltage at the complementary voltage node 52 represents the function NAND ($x_0$, $x_1$).

What has been described to this point is a fairly routine AND/NAND circuit. Indeed, the circuit of FIG. 1 would be functionally similar to the AND and NOR circuits disclosed by Yu et al. in U.S. Pat. No. 3,539,82 if the error correcting context is ignored. As mentioned previously, an AND circuit corrects many types of faults associated with shorted interconnections 10 and 12. However, if either of the redundant interconnections 10 and 12 are left open, the respective wire signal $x_0$ or $x_1$ is indeterminate and could be either a high or a low. The AND circuit described to this point is incapable of correcting a spuriously low wire signal $x_0$ or $x_1$.

In order to provide for the full correction of one of the interconnections 10 and 12 being open, pull-up resistors 58 and 60 are connected between the bases of the input transistors 40 and 44 and the power supply voltage $V_{CC}$. Taking the example of the pull-up resistors 60, if the interconnection 10 is being driven by a valid wire signal $x_0$, the pull-up resistor has little effect. If the wire signal $x_0$ is high, there is only a small voltage drop across the pull-up resistor 60. If the wire signal $x_0$ is low, the value of the pull-up resistor 60 has been chosen such that any current flowing through it can be easily driven by the driver of the interconnection 10. A preferred value of both pull-up resistors 58 and 60 would be in the range 15 kilohms–20 kilohms.

On the other hand, if one of the interconnections 10 and 12 is open, then there is no available current drive for that interconnection 10 or 12. As a result, the pull-up resistor 58 or 60 pulls the voltage at the respective input transistor 40 or 44 to a high logic level. That is, the pull-up resistors 58 and 60 convert an open fault to a fault that can be treated just like a short to high.

The AND circuit of FIG. 2, together with the pull-up resistor 58 and 60, would correct for one of the redundant interconnections 10 and 12 being open or being shorted to high. However, if the interconnection 10 or 12 is shorted to another interconnection carrying a different signal, the correction is uncertain. The effect of such a short between interconnections would be to, for instance, short together the true voltage node 56 of two different circuits. The likely result would be to drive both of the true voltage nodes to an invalid voltage, intermediate between a valid high and a valid low. That is, what has been described to this point does not provide for a dominant signal state.

This signal dominance can be provided by the use of emitter-follower outputs, comprising output transistors 62 and 64 having their collectors connected to the power supply voltage $V_{CC}$ and their emitters separated from ground by load resistors 66 and 68. The bases of the respective output transistors 62 and 64 are connected to the complementary voltage node 52 and to the true voltage node 56. As a result a, complementary output line 70 carries a complementary output signal $x_{CO}$ and a true output line 72 carries a true output signal $x_{TO}$. The signals $x_{CO}$ and $x_{TO}$ on the output lines 70 and 72 should have the previously mentioned 400 mV voltage swings. The values of the load resistors 66 and 68 are chosen to be much less than the values of the pull-up resistors 58 and 60, for example 500–1000 ohms. The use of emitter-follower outputs in the error-correcting AND circuits means that similar faults can be corrected on the output lines 22 and 24. If such faults are considered unimportant, the emitter follower outputs can be dispensed with. It is assumed that any logic function within the logic chip has similar emitter-follower outputs so that inputs to the error-correcting AND circuit have the required state dominance.

With the load resistor 66 being much smaller than the pull-up resistor 60, then in a high wire signal state, the output transistor 62 is in a high impedance state and the load resistor 66 is in series with a pull-resistor 60 of a different circuit between the power supply voltage $V_{CC}$ and ground. The small value of the load resistor 66 prevents a low wire signal $x_{CO}$ from being pulled to the high logic level. Another purpose of the emitter-follower transistor 62 and 64 is to bring the output signals $x_{CO}$ and $x_{TO}$ to the normal logic ranges.

Of course, the true output signal $x_{TO}$ is the corrected signal $x_{CORR}$ of FIG. 1. However, the complementary output signal $x_{CO}$ can be advantageously used if the following logic circuit can use a complementary signal.

Figure 3:
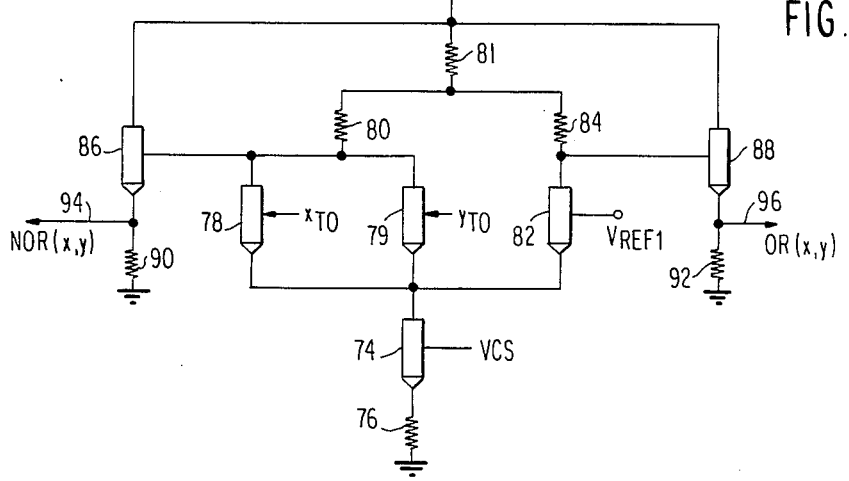
FIG. 3 is a circuit diagram of the NOR logic of FIG. 1.

An implementation of the NOR function 26 or 28, consistent with the design of the error correcting AND function of FIG. 2 is given in FIG. 3. A current driving transistor 74 and associated resistor 76 provides a constant current. Two logic transistors 78 and 79 are connected in parallel with their collectors commonly connected through resistors 80 and 81 to the power supply voltage $V_{CC}$. The bases of the logic transistors 78 and 79 are driven respectively by true outputs $x_{TO}$ and $y_{TO}$ of two error correcting AND circuits. A current steering transistor 82 effectively provides the fixed voltage $V_{REF1}$ against which the signals $x_{TO}$ and $y_{TO}$ are compared. A resistor 84 is connected in series to the resistor 81. Emitter-follower transistors 86 and 88 are separated from ground by respective load resistors 90 and 92, and are controlled by whether the constant current flows through the steering transistor 82 or through one or both of the logic transistors 78 and 79. Both a NOR output 94 and an OR output 96 are provided. The emitter-followers provide the proper type of signal dominance for any following error correcting AND circuit.

I claim:
1. An error correcting circuit comprising:
   at least one pair of interconnections for conveying two respective wire signals, said wire signals intended to both represent a logic input signal, said wire signals being of either a first potential state or a second potential state or a floating logic state, whenever any two interconnections conveying two wire signals being of different potential states are shorted together, said shorted interconnections both then conveying said first potential state; and an input logic circuit for each said pair of interconnections for comparing said wire signal and producing an output signal of:
(a) a third logic state if said two wire signals are both of said first potential state,
(b) a fourth logic state if said two wire signals are both of said second potential state, said fourth logic state being one of said first and second logic states and complementary to said third logic state,
(c) said fourth logic state if said two wire signals are respectively of said first and second potential states, and
(d) said third logic state if said two wire signals are respectively of said first and said floating potential states, and
(e) said fourth logic state if said two wire signals are respectively of said second and said floating potential states.

2. A circuit as recited in claim 1, further comprising an output circuit receiving said output signal for producing a buffered signal of either said first potential state or said second potential state on an output line and including means in said output circuit for maintainig said output line in said first potential state if said output line carrying said first potential state is shorted to an output line of another such maintaining means and carrying said second potential state.

3. A circuit as recited in claim 1, further comprising a logic circuit receiving said output signal and producing two equivalent buffered output signals on two output interconnections, said logic circuit further comprising two output circuits producing said first potential state or said second potential state on each of said output interconnections and including means in said output circuit for maintaining each of said output interconnections in said first potential state if said each output interconnection carrying said first potential state is shorted to an output interconnection of another such output circuit and carrying said second potential state.

4. A circuit as recited in claim 3, wherein said logic circuit comprises two equivalent logic circuits each having one of said output circuits producing one of said buffered output signals on one of said output interconnections.

5. An error correcting logic circuit, comprising:

a plurality of error correcting input circuits, each input circuit receiving two input interconnections carrying two respective wire signals, intended to both represent an input logic signal of a first logic state or a second logic state, said wire signal being of a first potential state, a second potential state or a floating potential state, said input circuit producing a corrected signal of:
(a) a third logic state if said two wire signals are both of said first potential state,
(b) a fourth logic state if said two wire signals are both of said second potential state, said fourth logic state being one of said first and second logic states and complementary to said third logic state,
(c) said fourth logic state if said two wire signals are respectively of said first and second potential states, and
(d) said third logic state if said two wire signals are respectively of said first and said floating potential states, and
(e) said fourth logic state if said two wire signals are respectively of said second and said floating potential states;

two equivalent logic circuits, each receiving said corrected signals from said plurality of input circuits and producing according to a predetermined logic function on a respective output interconnection an output signal, each said equivalent logic circuit including an output circuit, producing said first potential state or said second potential state on said output interconnection and including means in said output circuit for maintaining each of said output interconnections in said first potential state if said each interconnection carrying said first potential state is shorted to an output interconnection of another such output circuit and carrying said second potential state, the two output interconnections of said two equivalent logic circuits being connected to input interconnections of another said error correcting logic circuit.

6. An error correcting logic circuit as recited in claim 5, wherein said input circuits include resistive coupling to a voltage source at a potential of said first potential state.

7. An error correcting logic circuit as recited in claim 6, wherein said output circuits include resistive coupling to a voltage source at a potential of said second potential state.

8. An error correcting logic circuit as recited in claim 7, wherein said output circuits comprise an emitter-follower circuit.

* * * * *